United States Patent [19]

Kasperkovitz et al.

[11] Patent Number: 4,740,759

[45] Date of Patent: Apr. 26, 1988

[54] ANGLE DEMODULATOR WITH SECOND ORDER INTERFERENCE PREVENTION

[75] Inventors: Wolfdietrich G. Kasperkovitz; Harry B. Schoonheijm, both of Eindhoven, Netherlands

[73] Assignee: U.S. Philips Corporation, New York, N.Y.

[21] Appl. No.: 909,655

[22] Filed: Sep. 19, 1986

[30] Foreign Application Priority Data

Sep. 19, 1985 [NL] Netherlands ............ 8502562
Oct. 30, 1985 [NL] Netherlands ............ 8502967

[51] Int. Cl.4 .................. H03D 3/18; H03K 9/04
[52] U.S. Cl. ......................... 329/50; 329/107; 329/124
[58] Field of Search ........... 329/50, 107, 110, 122, 329/124, 137; 375/80, 81, 94, 99, 103, 120; 455/208, 214, 337; 331/23

[56] References Cited

U.S. PATENT DOCUMENTS 3,564,434  2/1971  Camenzind et al. ......... 455/208 X
4,365,205 12/1982  Dehaene .................. 375/81 X
4,426,735  1/1984  Kasperkovitz ............. 455/222

Primary Examiner—Eugene R. Laroche
Assistant Examiner—David Mis
Attorney, Agent, or Firm—Gregory P. Gadson

[57] ABSTRACT

Angle demodulator having a signal input (I) for applying an angle-modulated input carrier (A) thereto, which demodulator is coupled to a phase detection arrangement (2) to which also a quadrature detection carrier (D) frequency-coupled with the input carrier (A) is applied for demodulating the angle modulation signal, said quadrature detection carrier (D) being shifted at least substantially 90° in phase relative to the input carrier (A) at the central frequency of the input carrier (A), said phase detection arrangement (2) being coupled via a low-pass filter (6) to a signal output (O). Angle demodulators of this type, which may be designed as FM quadrature or PPL angle demodulators, cause a second order interference product which is inherent in the multiplication of two carriers (A and D) in mutual phase quadrature. According to the invention, to reduce the interference, a further carrier (B), which is either in phase or in anti-phase with the input carrier (A) at the central frequency, is generated, which carrier (B) is used in the phase detection arrangement (2) for compensating said interference product.

7 Claims, 3 Drawing Sheets

ANGLE DEMODULATOR WITH SECOND ORDER INTERFERENCE PREVENTION

BACKGROUND OF THE INVENTION

The invention relates to an angle demodulator comprising a phase detection arrangement having a first input for applying a square-wave, angle-modulated input signal to be demodulated, whose modulation frequency is of the same order as the carrier frequency, a second input and an output, and also comprising a carrier device for applying a quadrature detection carrier to the second input of the phase detection arrangement, at a central frequency of the input signal said quadrature detection carrier being shifted at least substantially 90° in phase relative to the input signal and a low-pass filter connected to the output of the phase detection arrangement.

An angle demodulator of this type may be constructed as an FM quadrature demodulator as is known, for example, from U.S. Pat. No. 4,426,735 or as a PLL-FM-PM demodulator as is known, for example, from U.S. Pat. No. 3,564,434.

In the case of an FM-quadrature demodulator the FM-modulated input signal to be demodulated is generally applied directly on the one hand and through a frequency-dependent phase shifter on the other hand to the phase detection arrangement. The frequency-dependent phase shifter realizes a frequency-dependent phase shift of the input signal, which is approximately 90° at a central frequency, generally the frequency which is centrally located in the frequency spectrum of the input signal. The quadrature detection carrier thus obtained is multiplied by the input signal resulting in the baseband frequency modulation signal which is available for further signal processing at the signal output of the angle demodulator after selection in the low-pass filter.

In the case of a PLL-FM/PM demodulator the phase detection arrangement and the low-pass filter combined with a voltage-controlled oscillator constitute a phase-locked loop in which the voltage-controlled oscillator supplies said quadrature detection carrier to the phase detection arrangement. Due to the loop operation the frequency of the quadrature detection carrier follows that of the input signal with a phase difference of 90°. The control signal for the voltage-controlled oscillator, i.e. the output signal from the low-pass filter thereby presents the baseband angle modulation signal.

In the multiplier circuit of the known angle demodulator a very strong second order interference product having twice the instantaneous frequency of the input signal is produced in addition to the desired baseband modulation signal. This second order interference product does not only occur in the case of multiplication of sinusoidal carriers, but also in the case of multiplication of non-sinusoidal, for example, amplitude-limited or squarewave carriers, which are often applied for practical reasons. In the latter case higher even order interference products may also be produced which, however, relative to the desired baseband modulation signal are further remote in frequency than said second order interference product. An acceptable interference suppression in the low-pass filter is only possible when the second order interference product (and hence also all higher order interference products) is sufficiently far remote in frequency from the desired baseband modulation signal.

In certain FM/PM signal processing devices and FM/PM transmission systems the difference between the minimum frequency of the input signal and the maximum modulation frequency is, however, chosen to be comparatively small and the modulation frequency is, at least instantaneously, of the same order as the carrier frequency. This may be necessary, for example, for video recorder (VCR's) and video record players (VLP's) to record or read information with a high packing density, for example, in FM-receivers with swing compression to make an integratable realization possible and for example in wireless telephone apparatus to comply with legal prescriptions. In that case said second harmonic interference may occur very close to or, if the modulation frequency is larger than twice the carrier frequency, it may even occur within the frequency range of the desired baseband modulation signal so that an adequate interference suppression by means of simple filters is not possible.

SUMMARY OF THE INVENTION

It is an object of the invention to prevent or at least inhibit said second order interference product from occurring in the demodulation of a square-wave, angle-modulated input signal to be demodulated, whose modulation frequency is of the same order as the carrier frequency.

To this end an angle demodulator of the type described in the opening paragraph according to the invention is characterized in that the carrier device is also adapted to supply a further detection carrier at the central frequency of the input signal being at least substantially in phase or in anti-phase with the input signal, in that the phase detection arrangement has a third input for applying the further detection carrier, and in that the phase detection arrangement is adapted to apply a signal to its output, said signal mainly corresponding to $(A-B) \times D$, wherein A represents the input signal, D represents the quadrature detection carrier and B represents the further common-mode detection carrier.

The article "Phase-locked loops" by S. C. Gupta, published in proceedings of the IEEE, Vol. 63, No. 2, February 1975. New York U.S., page 294 shows a theoretical noise-optimized model of an analog phase-locked loop, which itself may be read on the above-mentioned characterization. However, since a demodulation of angle-modulated input signals is aimed at with this model, which is noise-optimized, these input signals should be sinusoidal and a (theoretical) use on square-wave angle-modulated input signals is excluded. Moreover, this model includes a non-realizable filter so that a direct use of the model in practice is not possible, according to this article.

The invention is based on the recognition that in the last-mentioned phase detection arrangement said second and possibly higher order interference products are compensated and that the information of the angle (phase- or frequency-) modulation signal is maintained upon this compensation. Since the further detection carrier at the central frequency may be in phase or in anti-phase relative to the input signal said compensation can be easily realized by means of a subtractor or adder circuit, respectively.

When using the measure according to the invention the object of the invention is achieved with the said compensation and in addition it prevents higher order demodulation products from occurring in the output signal of the phase detection arrangement in the absence of the modulation signal. In the presence of the modulation signal, a considerable reduction in these higher order demodulation products is generally obtained.

In order to obtain a simple realization, the angle demodulator according to the invention is preferably characterized in that the phase detection arrangement includes a compensation circuit for at least partly compensating the input signal with the further detection carrier at said central frequency, and a multiplier circuit for multiplying the compensated signal by the quadrature detection carrier.

The invention is applicable both to an FM quadrature demodulator and to a PLL-FM/PM demodulator.

An FM-quadrature demodulator according to the invention is preferably characterized in that the carrier device comprises a cascade arrangement of first and second phase shifters, each realizing a frequency-dependent phase shift which is substantially 90° at the central frequency of the input signal, the output of the first phase shifter being coupled to the second input of the phase detection arrangement, and the output of the second phase shifter being coupled to the third input of the phase detection arrangement For use of the latter measure, only one phase-shifter in addition to the frequency-dependent phase shifter already provided for deriving the quadrature detection carrier is required, which as a so-called second frequency-dependent phase shifter, derives said further detection carrier from the quadrature detection carrier. With a suitable impedance adaptation and when using compensation in the input signal path of the multiplier, the compensation circuit may then be constituted by simply coupling the output of the second phase shifter with the input signal path of the multiplier circuit.

In FM-receivers based on the receiver principle as applied in the integrated circuit TDA 7000 in which such an additional phase shifter is already present to generate a muting control signal, it is only the latter coupling that is required for use of the invention.

In the case of a PLL-FM/PM demodulator according to the invention in which the carrier device includes a voltage-controlled oscillator which, combined with the phase detection arrangement and the low-pass filter, is incorporated in a phase-locked loop, and in which an output of the oscillator for supplying the quadrature detection carrier is coupled to the second input of the phase detection arrangement, the demodulator is preferably characterized in that the oscillator also has an output for supplying the further detection carrier, said output being coupled to the third input of the phase detection arrangement.

With this measure, the invention is applicable in a simple manner to virtually any existing PLL-FM/PM demodulator. For that purpose, the voltage-controlled oscillator of such a PLL-demodulator is to supply two oscillator signals in phase-quadrature. This occurs frequently in practice, for example, in synchronous detection: the quadrature oscillator signal is then utilized for the phase-coupling of the oscillator to the input signal; the in phase or anti-phase oscillator signal for synchronous demodulation.

A preferred embodiment of the latter angle demodulator based on the PLL-FM/PM demodulation principle is characterized in that an amplifier circuit having a polarity dependent amplification is arranged between the output of the phase detection arrangement and the voltage-controlled oscillator, which amplifier circuit amplifies the control signal for the voltage-controlled oscillator in the case of a negative phase difference between the input signal and the further detection carrier to a greater extent than in the case of a positive phase difference there between.

When using this measure, a distortion reduction in the above-mentioned PLL-FM/PM demodulator is obtained, which is particularly advantageous in the case of a comparatively large modulation swing.

A further preferred embodiment of an angle demodulator of this type is characterized in that the amplifier circuit is arranged between the output of the multiplier circuit and the low-pass filter, and comprises first and second voltage-controlled threshold current circuits, both of which receive the output voltage from the multiplier circuit which voltage varies in magnitude and direction with said phase difference, said first current circuit applying a first current to the low-pass filter upon exceeding a first threshold voltage, and said second current circuit applying a second current to the low-pass filter upon falling below a second threshold voltage, said two currents deviating from each other in magnitude and direction.

By suitable choice of the two threshold voltages, the results of an incomplete compensation in the compensation circuit are eliminated by means of this measure.

DESCRIPTION OF THE DRAWINGS

The invention will be further described with reference to the Figures shown in the drawing by way of example.

In this drawing.

DETAILED DESCRIPTION

Figure 1:
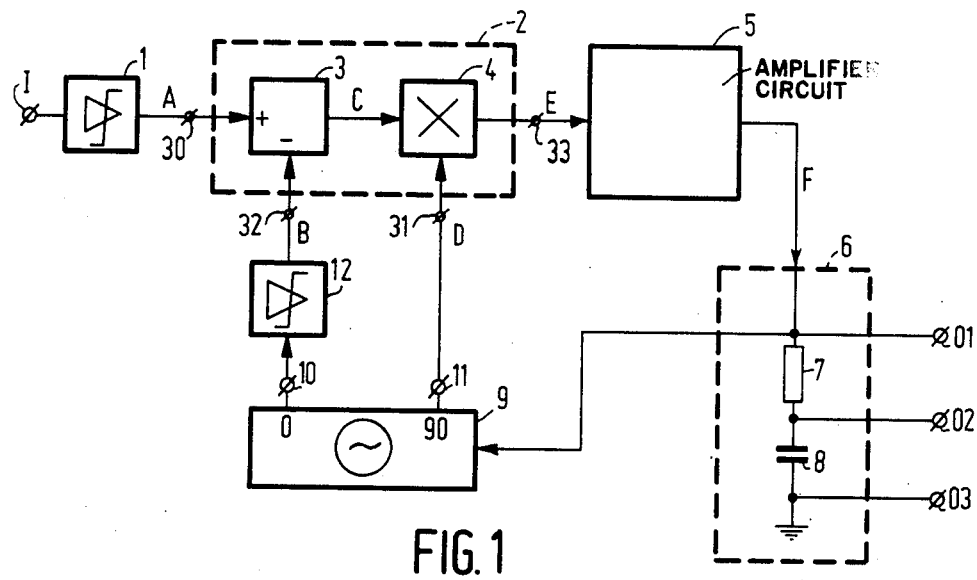
FIG. 1 shows a PLL-FM/PM or PLL angle demodulator according to the invention.

FIG. 1 shows a PLL angle demodulator according to the invention having a signal input I for applying an angle-modulated input signal thereto and a signal output 01–03 from which the demodulated baseband angle modulation signal is delivered. The PLL angle demodulator has a limiter circuit 1 coupled to its signal input I, followed by a phase-locked loop 2–12 incorporating successively, a phase detection arrangement 2, an amplifier circuit 5, a low-pass filter 6 coupled to the signal output 01–03, a voltage-controlled oscillator 9 supplying two oscillator signals in phase quadrature, the common mode signal which is in phase relative to the input signal at the central frequency of this input signal, being applied to a common mode output 10 and the signal which is in phase quadrature with the input signal at the central frequency being applied to a quadrature output 11, as well as a limiter circuit 12 arranged between the common mode output 10 and the phase detection arrangement 2.

The phase-detection arrangement 2 has a first input 30, a second input 31, a third input 32 and an output 33.

The phase-detection arrangement 2 is further provided with a compensation circuit connected to the inputs 30 and 32 and a multiplier circuit 4 connected to the output of the compensation circuit 3 and the input 31. The compensation circuit 3 receives on the one hand an amplitude-limited, angle-modulated input signal A from the limiter circuit 1, and on the other hand the amplitude-limited, common mode or in-phase oscillator signal as a so-called further detection carrier B from the limiter circuit 12. The limiter circuits 1 and 12 have been adjusted in such a manner that the carriers A and B are amplitude-limited to mutually the same value. The carriers A and B are subtracted from each other in the compensation circuit 3, which results in a pulse-shaped signal C constituting an input signal for the multiplier circuit 4. The quadrature oscillator signal functioning as a so-called quadrature carrier D is applied to the multiplier circuit 4 from the quadrature output 11 of the voltage-controlled oscillator 9, which causes an error signal E upon multiplication by the pulse-shaped signal C. After suitable amplification in the amplifier circuit 5, this error signal E is applied via the output 33 to the low-pass filter 6 in which the baseband angle-demodulator signal is obtained, which is applied on the one hand to terminals 01, 02 and 03 of the signal output 01-03 for further signal processing and/or reproduction, and on the other hand to the voltage-controlled oscillator 9 for a phase coupling of the loop with the input signal A.

In the case of an PLL-PM demodulator, a further low-pass filter passing only the d.c. voltage component of the demodulated signal to the oscillator may be disposed between the low-pass filter 6 and the voltage-controlled oscillator.

Figure 2:
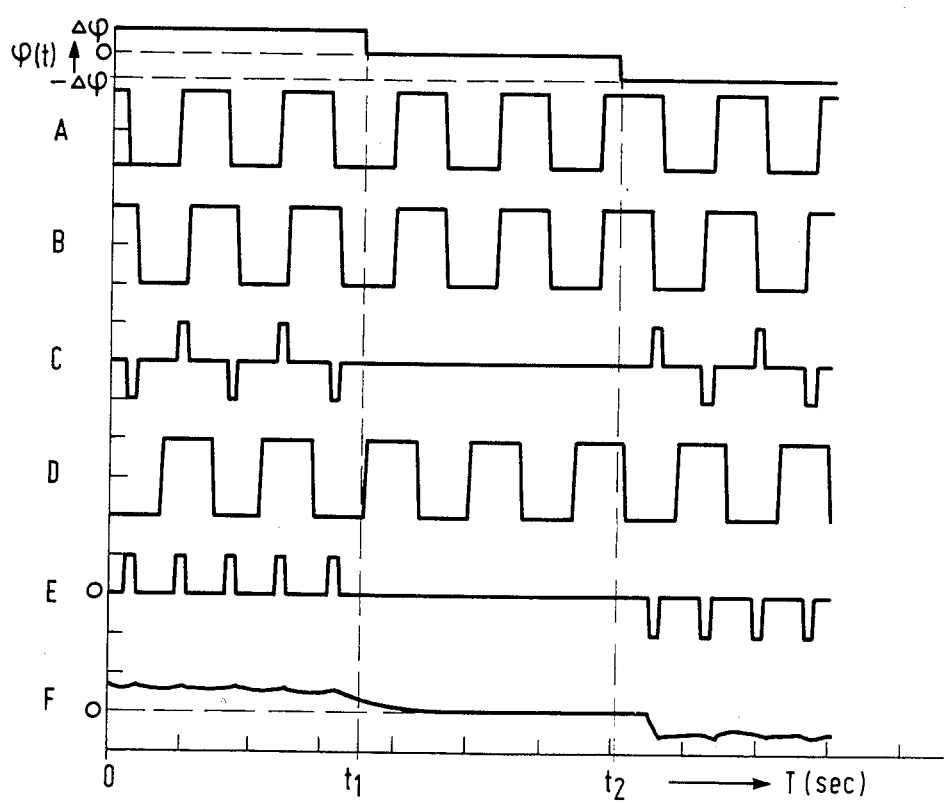
FIG. 2 shows a number of graphs to illustrate the operation of the PLL angle demodulator of FIG. 1.

To explain the operation of the PLL angle demodulator according to the invention, reference is made to graphs A to F, inclusive of FIG. 2. For the sake of simplicity, an open loop situation has initially been shown in which the oscillator is in a free running state. The graph $\Psi(t)$ has a step-shaped variation of the angle-modulation signal, shifting the input signal A during a period $O-t_1$ over an angle $\Delta\Psi$ relative to the in-phase detection carrier B at the free-running frequency of the voltage-controlled oscillator 9, being zero during a period $t_1-t_2$, during a period larger than $t_2$ shifting the input signal A over an angle $-\Delta\Psi$ relative to the in-phase detection carrier B in free-running state of the oscillator.

During the period $t_1-t_2$ the carriers A and B are mutually equal so that the signal C is zero in this period. The output signal E of the multiplier circuit 4 is therefore also zero and, unlike conventional PLL angle demodulators, it does not have a second order interference product. Since such periods may occur frequently and for a comparatively long time in normally occurring modulation signals, the interference reduction obtained by the compensation is consequently already considerable.

During the occurrence of the positive phase difference in $(O-t_1)$ between the carriers A and B, pulses are produced in successively alternating polarity directions in the signal C, which alternation on the one hand results from the reversal of direction of the subtraction in the compensation circuit 3 at the successive leading and trailing edges of the carriers A and B, and on the other hand is determined by the sign of the phase difference. The width of successive pulses provides information on the absolute magnitude of the phase difference.

Also, during the occurrence of the negative phase difference $-\Delta\Psi$ in $(t>t_2)$ between the carriers A and B, pulses in successively alternating polarities occur in the signal C whose width indicates the absolute magnitude of the phase difference and whose polarity is determined by the polarity change resulting from the successive alternation of leading and trailing edges and the polarity of the phase difference.

The polarity change of the pulses caused by the alternation in edge direction and the signal subtraction operation successively being effected in the compensation circuit C is eliminated due to multiplication of the signal C by the quadrature detection carrier D. This results in the pulse-shaped error signal E, in which pulse series occur at a pulse repetition frequency which is twice the instantaneous frequency $f_{IN}$ of the input signal A during the periods when there is a phase difference between the carriers A and B. The pulse series in the period $O-t_1$ then has a sign which is opposite relative to the pulse series in the period larger than $t_2$, so that the polarity of the pulses is uniformly dependent on the polarity of the modulation signal. The 2nd order harmonic interference at $2f_{IN}$ during these pulse series amounts approximately to 90 and is therefore considerably less than in the corresponding output signal of a phase detection arrangement of a conventional PLL angle demodulator.

Moreover, since this phase difference substantially occurs only when the modulation signal deviates from zero, the ratio between desired and undesired signal components in the output signal of the low-pass filter 6 being greatly improved relative to that in conventional PLL angle-demodulators, both in the case where $2f_{IN}$ falls within and beyond the base frequency band of the modulation signal. This is particularly true of small amplitudes of the modulation signal.

By low-pass filtering of the error signal E in the low-pass filter 6 the baseband modulation signal F is selected, while possible higher order interference products falling beyond the base frequency band of the modulation signal are suppressed. The baseband modulation signal F is subsequently applied to the signal output 01-03.

In the embodiment shown, the amplifier circuit 5 includes a voltage current converter, and the low-pass filter 6 is realized by means of a series arrangement of a resistor 7 coupled to a common connection between the amplifier circuit 5 and the voltage-controlled oscillator 9, and a capacitor 8 connected to ground, while the ends of these elements 7 and 8 are coupled to terminals 01, 02 and 03, respectively, of the signal output 01-03. When the PLL angle demodulator is used for demodulating the FM stereo multiplex signal, the stereo difference signal $(L-R)$ is available across the resistor 7, i.e., across the terminals 01 and 02, the stereo sum signal $(L+R)$ or the mono signal is available across the capacitor 8, i.e., 02 and 03, and the entire baseband stereo multiplex signal is available across the terminals 01 and 03.

The PLL angle demodulator described so far has an asymmetrical demodulation operation, which will be explained with reference to the graphs in FIGS. 3A and 3B. These Figures show the behavior of the PLL angle demodulator and, for the sake of simplicity, initially a situation without low-pass filter 6 (in the given case comparable to a situation in which the capacitor 8 has a, very high capacitance) for a negative phase variation $-\Delta\Psi$ and a positive phase variation $\Delta\Psi$, respectively, of the input signal A(t) relative to the central carrier frequency $f_o$ occurring at $t_o$.

Figure 3A:
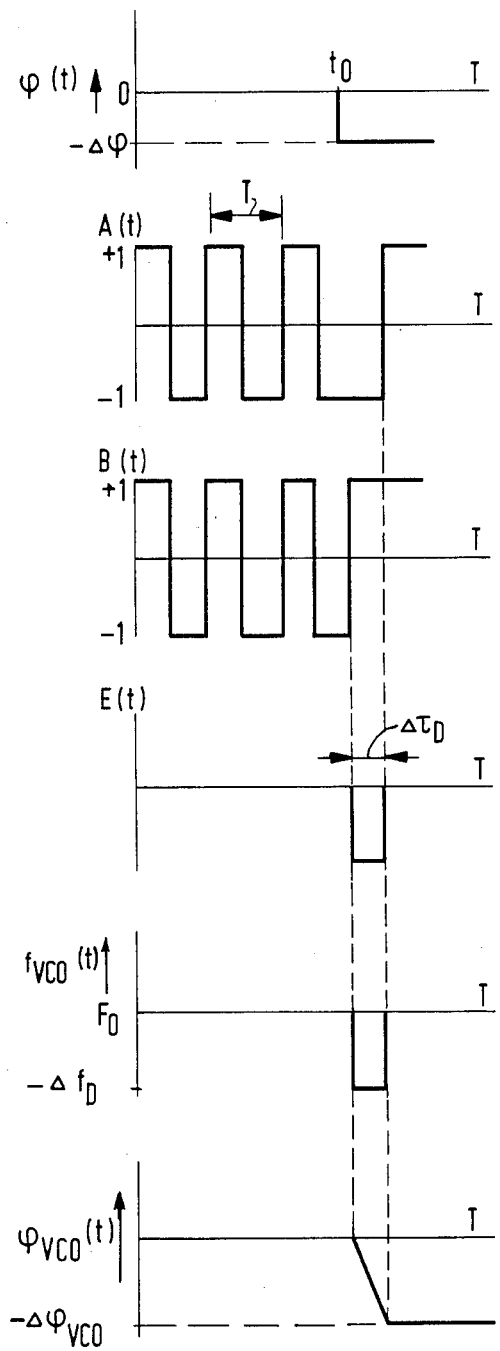
FIGS. 3A and 3B show a number of graphs to illustrate the asymmetry in the demodulation operation of the PLL angle demodulator of FIG. 1.

FIG. 3A shows that the negative variation $-\Delta\Psi$ results in a delay of the next zero crossing in the input signal A(t) after $t_o$ over a period $\Delta_D$ relative to the corresponding zero crossing in the common mode detection carrier B(t). Starting from a closed loop situation without phase deviations, B(t) corresponds in phase and frequency to the central frequency $f_o$ of the input signal A before and immediately after $t_o$, so that $\Delta_D = \Delta\Psi/2\pi f_o$. During this period $\Delta_D$ an error signal E(t), which occurs at the output of the multiplier circuit 4, has a control signal for the voltage-controlled oscillator 9, and this error signal E(t) causes the oscillator frequency $f_{VCO}$ to decrease by $\Delta f_D$. This results in a decrease of the oscillator phase $\Psi_{VCO}(t)$ by $\Delta\Psi_{VCO} = \Delta\Psi \cdot \Delta_D/f_o$.

Figure 3B:
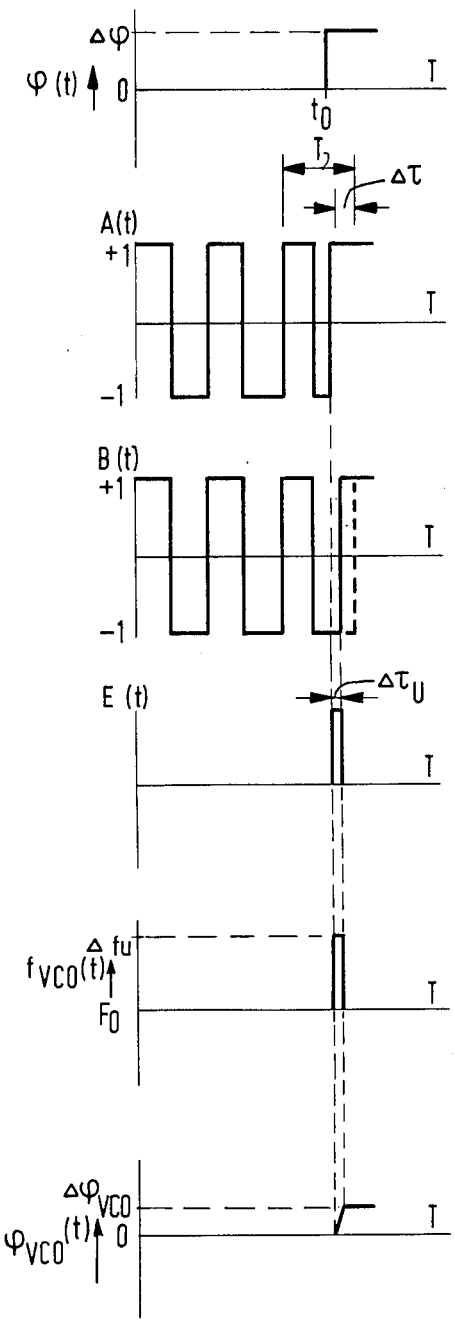

FIG. 3B shows that the positive variation $\Delta\Psi$, whose magnitude is equal to the above-described negative variation $-\Delta\Psi$, results in an earlier occurrence of the next zero crossing after $t_o$ in A(t) followed by an earlier occurrence of the corresponding zero crossing in B(t) after a control through the voltage-controlled oscillator 9. Since error signal E(t) as a control signal for the voltage-controlled oscillator 9 brings the oscillator frequency fhd VCO(t) to a value of $f_o + \Delta f_U$ immediately after the zero crossing in A(t), the duration of this error signal E(t), i.e., the duration between the said zero crossing in A(t) and the corresponding zero crossing in B(t) is:

$$\Delta_U + \Delta\Psi/2\pi(f_o + \Delta f_U),$$

which is shorter than $\Delta_D$. In this shorter duration $\Delta_U$ the oscillator phase $\Psi_{VCO}(t)$ increases by $$\Delta\Psi_{VCO} = \Delta\Psi \cdot \Delta f_U/(f_o + f_U).$$

It is evident from the foregoing that for a negative phase or angle variation the magnitude of the decrease in the oscillator frequency is larger than the magnitude of the increase in the oscillator frequency in the case of a positive angle variation of equal magnitude.

This polarity asymmetry is not disturbing or hardly disturbing for small phase variations, i.e., small amplitudes of the angle modulation signal. For a larger modulation swing it may, however, be advantageous to compensate for this asymmetry in order to avoid distortion, which can be realized in a simple manner by providing an opposed polarity asymmetry in the amplification characteristic of the amplitifer circuit 5. In fact, it can be derived from the foregoing that input angle variations $\Delta\Psi$ of equal magnitude in the two polarity directions result in oscillator angle variations $\Delta\Psi_{VCO}$ in both polarity directions of mutually equal magnitude when $$\Delta f_D = \frac{\Delta f_u}{1 \pm \frac{\Delta f_u}{f_o}} \qquad (1)$$

Complete compensation is obtained by choosing the amplification factor of the amplifier circuit 5 for error signals E(t) at a positive input angle variation to be larger corresponding to (1) than that at a negative input angle variation. For example, with $\Delta f_U = 4 f_o$, $\Delta f_D$ becomes $4/5 f_o$, so that the said amplification factor for a positive input angle variation should be 5 times as large as that for a negative input angle variation so as to obtain a complete compensation of the loop asymmetry.

Figure 4:
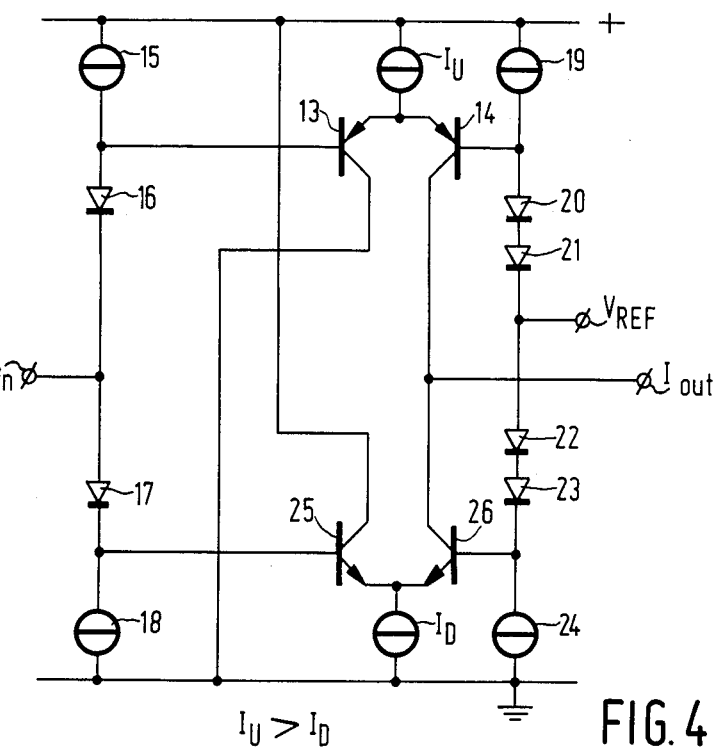
FIG. 4 shows a direction-dependent amplifier circuit compensating the said asymmetry when incorporated in the PLL angle demodulator.

FIG. 4 shows a practical embodiment of an asymmetric amplifier circuit 5 having a voltage signal input $V_{in}$, a current signal output $I_{out}$, and a voltage reference input $V_{REF}$ for applying a threshold voltage. The voltage signal input $V_{in}$ is coupled to the output 33 of the phase detection arrangement 2 and receives the error signal E(t), while the current signal output $I_{out}$ is coupled via the resistor 7 to the capacitor 8 functioning as an integration capacitor of the low-pass filter 6. The amplifier circuit 5 has first and second threshold current source circuits ($I_U$, 13-14) and ($I_D$, 25-26) incorporating an emitter-coupled PNP transistor pair (13, 14), whose emitters are connected to a supply voltage via a common current source $I_U$, and an emitter-coupled NPN transistor pair 25, 26, respectively, whose emitters are connected to ground via a common current source $I_D$. The base electrodes of input transistors 13 and 25 of these two transistor pairs (13, 14) and (25, 26) are connected via a first DC voltage shift circuit 15-18 to the input $V_{in}$, while the collectors of these input transistors are coupled to ground and to the supply voltage, respectively. The base electrodes of output transistors 14 and 26 of the said transistor pairs (13, 14) and (25, 26) are connected via a second d.c. voltage shift circuit (19-24) to the voltage reference input $V_{REF}$, while their connectors are commonly connected to the current signal output $I_{out}$. Each d.c. voltage shift circuit (15-18) and (19-24) comprises a diode circuit (16, 17) and (20-23) whose anode connection is coupled at one end via current sources 15 and 19 to the supply voltage and at the other end to the base electrodes of the transistors 13 and 14, and whose cathodes connection is coupled via current sources 18 and 24 to ground at one end and to the base electrodes of the transistors 25 and 26 at the other end.

The diode circuit 16, 17 comprises a series arrangement of two diodes 16 and 17 whose common connection is coupled to the voltage signal input $V_{in}$. The diode circuit 20-23 comprises a series arrangement for four diodes 20 to 23 inclusive, whose common connection between the diodes 21 and 22 is coupled to the voltage reference input $V_{REF}$. As a result, the output transistors 14 and 26 are blocked and the currents from the current sources $I_U$ and $I_D$ are removed to ground and to the supply, respectively, via the collectors of the input transistors 13 and 25 in the case of a voltage at the signal input $V_{in}$, which is equal to a reference voltage at the reference input $V_{REF}$. When the input voltage increases relative to the reference voltages, for example, as a result of a positive angle variation of the input signal A(t), the base voltage of the input transistor 13 can exceed the first threshold voltage of the current source circuit ($I_U$, 13-24) determined by the reference voltage and the voltages across the diodes 20 and 21 and the diode 16 so that the output transistor 14 starts conducting and applies the current from the current source $I_U$ as a so-called first current to the current signal output $I_{out}$. When the input voltage decreases relative to the reference voltage, for example, as a result of a negative angle variation of the input signal A(t), the base voltage of the input transistor 25 may fall below the second threshold voltage determined by the reference voltage and the voltage across the diodes 17, 22 and 23, so that the output transistor 26 starts conducting and withdraws the current from the current source $I_D$ as a so-called second current from the current signal output $I_{out}$. The current direction at the current output is thus dependent on the direction of the said angle variation. The magnitudes of the two currents have been mutually chosen in such a ratio that the asymmetry of the loop behavior is compensated thereby. In the given example the current from the current source $I_U$ is to be chosen to be 5 times as large as that of the current source $I_D$ for this purpose.

Since the amplifier circuit 5 does not supply a current signal in the range between the two threshold voltages, amplitude variations in the error signal E(t) which may be caused, for example, by an incomplete compensation in the compensation circuit 3 can be eliminated. As a result the influence of, for example, mutual deviations in the limitation levels of the limiter circuits 1 and 12 on the reliability of the demodulation operation, is greatly reduced.

Figure 5:
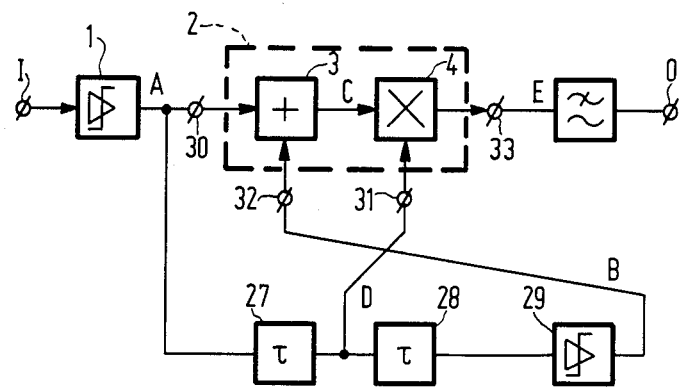
FIG. 5 shows a further angle demodulator according to the invention, based on a conventional FM quadrature demodulator.

FIG. 5 shows an embodiment of an angle demodulator according to the invention which is applicable in a simple manner to conventional FM quadrature demodulators, and whose elements corresponding to those of the PLL angle demodulator of FIG. 1 have the same reference numerals.

Unlike the above-described PLL angle demodulator, the quadrature and further detection carrier which are frequency-coupled with the input signal, are not regenerated with the aid of a phase-coupled oscillator, but derived from the input signal by means of first and second cascade-arranged phase shifters 27 and 28, each realizing a frequency-dependent phase shift which is substantially 90° at the central frequency of the input signal. To this end these phase shifters may either be formed as delay circuits each having a delay=$\frac{1}{4}f_o$ with $f_o$ being the central frequency of the input signal, or they may be formed as RC circuits, such as are already applied for another purpose in FM receivers, based on the integrated circuit TDA 7000. In the embodiment shown, the first phase shifter 27 is coupled at one end to the limiter circuit 1, and at the other end to the second phase shifter 28, and via the input 31 of the phase detection arrangement 2 to the multiplier circuit 4. An output of the second phase shifter 28 is coupled via a limiter circuit 29 and via the input 32 of the phase detection arrangement 2 to the compensation circuit 3, which may be constituted in this case by an adder circuit due to the anti-phase relation of the detection carrier 3 relative to the input signal A at the central frequency.

The same as described hereinbefore with reference to FIG. 2 applies to the demodulation operation, but of course on the understanding that the output signal from the phase detection arrangement cannot be characterized as an error signal, but as a signal which results in the desired baseband modulation signal after suitable filtering in the low-pass filter 6. Due to the absence of a loop operation, this angle-demodulator does not exhibit any demodulation asymmetry with respect to the direction of the phase variations.

Figure 6:
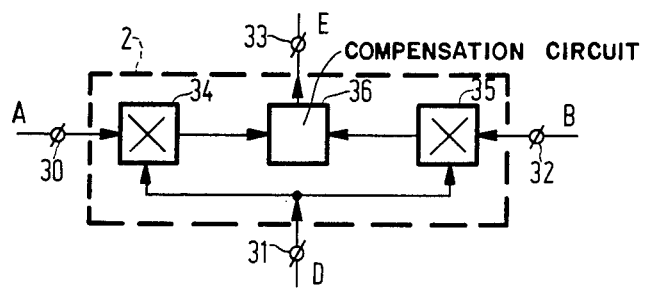
FIG. 6 shows a further embodiment of a phase detection arrangement for use in an angle demodulator according to the invention.

In the phase detection arrangement 2 of FIGS. 1 and 5 the input signal A is first compensated with the in-phase or anti-phase detection carrier B, the resulting signal E being subsequently multiplied by the quadrature detection carrier D. When using a second multiplier, it is alternatively possible to multiply the input signal A and the further detection carrier B by the quadrature detection carrier D separately, and to subsequently apply the output signals of the two multipliers to a compensation circuit. This is shown in FIG. 6, in which element corresponding to those in FIGS. 1 and 5 have the same reference numerals. The carriers A and D are multiplied in a first multiplier 34, the carriers B and D are multiplied in a second multiplier 35, and the output signals of the two multipliers are applied to a compensation circuit 36, which applies the detected, but non-filtered signal E to the output 33. If the carrier B is in phase with the signal A at the central freuquency, the compensation circuit is a subtractor circuit, whereas it is an adder circuit if the carriers are in anti-phase with each other.

It is to be noted that when suitably dimensioning the circuits, it is also possible to omit the limiter circuits 1, 12 and 29. Furthermore the use of the inventive idea will not be difficult to those skilled in the art when a low-pass filter 6 other than that shown in FIG. 1 and an asymmetric amplifier circuit 5 other than that shown in FIG. 4 are used, for example, a non-threshold amplifier circuit which upon adaptation of the control characteristic of the voltage-controlled oscillator 9 applies a current at a negative angle variation of the input signal A(t) and withdraws a current from the current signal output $I_{out}$ at a positive angle variation while it is obvious that the invention also results in the envisaged effect in the case of small constant deviations of the said 0°/90° or 90°/180° phase relation between the said carriers.

Furthermore, it is to be noted that it may be obvious to choose as the central frequency, the frequency located in the center of the frequency spectrum of the angle-modulated input signal, as, for example, for audio modulation signals, but under given circumstances it may be desirable to choose a different frequency within this spectrum as a central frequency, for example, the frequency corresponding to the black level of the relevant video signal in the case of video modulation signals.

What is claimed is:

1. An angle demodulator comprising: a phase detection arrangement having a first input for applying a square-wave, angle-modulated input signal to be demodulated, whose modulation frequency is of the same order as the carrier frequency, a second input and an output; a carrier device for applying a quadrature detection carrier to the second input of the phase detection arrangement at a central frequency of the input signal, said quadrature detection carrier being shifted at least substantially 90° in phase relative to said input signal; and a low-pass filter connected to the output of the phase detection arrangement, characterized in that the carrier device is also adapted to supply a further detection carrier at the central frequency of the input signal being at least substantially in phase or in anti-phase with the input signal, in that the phase detection arrangement has a third input for applying the further detection carrier, and in that the phase detection arrangement is adapted to apply a signal to its output, said signal mainly corresponding to $(A-B) \times D$, wherein A represents the input signal, D represents the quadrature detection carrier and B represents the further common-mode detection carrier.

2. The angle demodulator in claim 1, wherein the phase detection arrangement includes a compensation circuit for at least partly compensating the input signal with the further detection carrier at said central frequency, and a multiplier circuit for multiplying the compensated signal by the quadrature detection carrier.

3. The angle demodulator in claim 1, wherein the carrier device comprises a cascade arrangement of first and second phase shifters of the input signal, each realizing a frequency-dependent phase shift which is substantially 90° at the central frequency of the input signal, the output of the first phase shifter being coupled to the second input of the phase detection arrangement and the output of the second phase shifter being coupled to the third input of the phase detection arrangement.

4. The angle demodulator in caim 1, wherein the carrier device includes a voltage-controlled oscillator which, combined with the phase detection arrangement and the low-pass filter, is incorporated in a phase-locked loop, and in which an output of the oscillator for supplying the quadrature detection carrier is coupled to the second input of the phase detection arrangement, wherein the oscillator also has an output for supplying the further detection carrier, said output being coupled to the third input of the phase detection arrangement.

5. The angle demodulator in claim 4, wherein an amplifier circuit having a polarity dependent amplification is arranged between the output of the phase detection arrangement and the voltage-controlled oscillator, said amplifier circuit amplifying the control signal for the voltage-controlled oscillator in the case of a negative phase difference between the input signal and the further detection carrier to a greater extent than in the case of a positive phase difference therebetween.

6. The angle demodulator in claim 5, wherein the amplifier circuit is arranged between the output of the multiplier circuit and the low-pass filter and comprises first and second voltage-controlled threshold current circuits, both of which receive the output voltage from the multiplier circuit, which voltage varies in magnitude and direction with the said phase difference, said first current circuit applying a first current to the low-pass filter upon exceeding a first threshold voltage, and said second current circuit applying a second current to the low-pass filter upon falling below a second threshold voltage, said two currents deviating from each other in magnitude and direction.

7. The angle demodulator in any one of the preceding claims, wherein both the input signal and the further detection carrier are applied via an amplitude limiter circuit to the phase detection arrangement.

* * * * *